(12) United States Patent
Bosch et al.

(10) Patent No.: US 8,358,051 B2
(45) Date of Patent: Jan. 22, 2013

(54) PIEZOELECTRIC ACTUATOR

(75) Inventors: Russell H. Bosch, Gaines, MI (US);
Michael Peter Cooke, Gillingham (GB);
Christopher Andrew Goat, Offham (GB)

(73) Assignee: Delphi Technologies Holding S.arl, Troy, MI (US)

( * ) Notice: Subject to any disclaimer, the term of this patent is extended or adjusted under 35 U.S.C. 154(b) by 677 days.

(21) Appl. No.: 11/991,894

(22) PCT Filed: Jul. 7, 2006

(86) PCT No.: PCT/GB2006/002519
§ 371 (c)(1),
(2), (4) Date: Jun. 4, 2010

(87) PCT Pub. No.: WO2007/031700
PCT Pub. Date: Mar. 22, 2007

(65) Prior Publication Data
US 2010/0237751 A1 Sep. 23, 2010

(30) Foreign Application Priority Data
Sep. 16, 2005 (EP) .................................. 05255752

(51) Int. Cl.
*H01L 41/083* (2006.01)
(52) U.S. Cl. ........ 310/366; 310/328; 310/363; 310/364; 310/365
(58) Field of Classification Search .................. 310/328, 310/363, 364, 365, 366
See application file for complete search history.

(56) References Cited

U.S. PATENT DOCUMENTS

| 4,903,166 | A | | 2/1990 | Galvagni | |
|---|---|---|---|---|---|
| 4,932,119 | A | * | 6/1990 | Ealey et al. | 29/593 |
| 5,089,739 | A | * | 2/1992 | Takahashi et al. | 310/328 |
| 5,237,239 | A | * | 8/1993 | Inoue et al. | 310/328 |
| 5,438,232 | A | * | 8/1995 | Inoue et al. | 310/328 |
| 2002/0089266 | A1 | | 7/2002 | Bindig et al. | |

(Continued)

FOREIGN PATENT DOCUMENTS

| DE | 197 04 389 | 8/1998 |
|---|---|---|
| EP | 0 479 328 | 4/1992 |

(Continued)

OTHER PUBLICATIONS

English translation of JP 10-241993, Fuda Yoshiaki, Nov. 9, 1998.*

(Continued)

*Primary Examiner* — Walter Benson
*Assistant Examiner* — Bryan Gordon
(74) *Attorney, Agent, or Firm* — Mark H. Svoboda

(57) ABSTRACT

A piezoelectric actuator comprises a co-fired stack of piezoelectric elements formed from a piezoelectric material and a plurality of positive internal electrodes interdigitated with a plurality of negative internal electrodes throughout the stack to define active regions of the piezoelectric material which are responsive to a voltage applied across the internal electrodes, in use. An external positive electrode connects with the positive internal electrodes and an external negative electrode connects with the negative internal electrodes. The actuator is characterized in that the stack further comprises means for deliberately creating artificial cracks within the stack at a location at which the artificial cracks do not give rise to a short circuit between the internal electrodes but serve to relieve stresses within the piezoelectric material.

4 Claims, 10 Drawing Sheets

U.S. PATENT DOCUMENTS

| | | | |
|---|---|---|---|
| 2006/0055288 A1* | 3/2006 | Heinzmann et al. | 310/364 |
| 2006/0238073 A1 | 10/2006 | Ragossnig et al. | |
| 2007/0269667 A1* | 11/2007 | Kobayashi et al. | 428/469 |
| 2008/0218029 A1* | 9/2008 | Dollgast et al. | 310/328 |

FOREIGN PATENT DOCUMENTS

| | | |
|---|---|---|
| EP | 1 204 152 | 5/2002 |
| JP | 4-214686 | 8/1992 |
| JP | 10241993 | 9/1998 |
| JP | 2001 102646 | 4/2001 |
| JP | 2001-156348 | 6/2001 |
| JP | 2001-267646 | 9/2001 |
| JP | 2004-288794 | 10/2004 |
| JP | 2006-203070 | 8/2006 |
| WO | 01/01499 | 1/2001 |
| WO | 2003/015246 | 12/2003 |
| WO | 2004/077583 | 9/2004 |
| WO | 2006/042791 | 4/2006 |

OTHER PUBLICATIONS

Boaro, et al: "Synthesis of Highly Porous Yttria-Stablized Zirconia by Tape-Casting Methods", Aug. 19, 2002, pp. 395-400.
Japan Office Action dated May 11, 2011.
Japan Office Action dated Feb. 21, 2012.

* cited by examiner

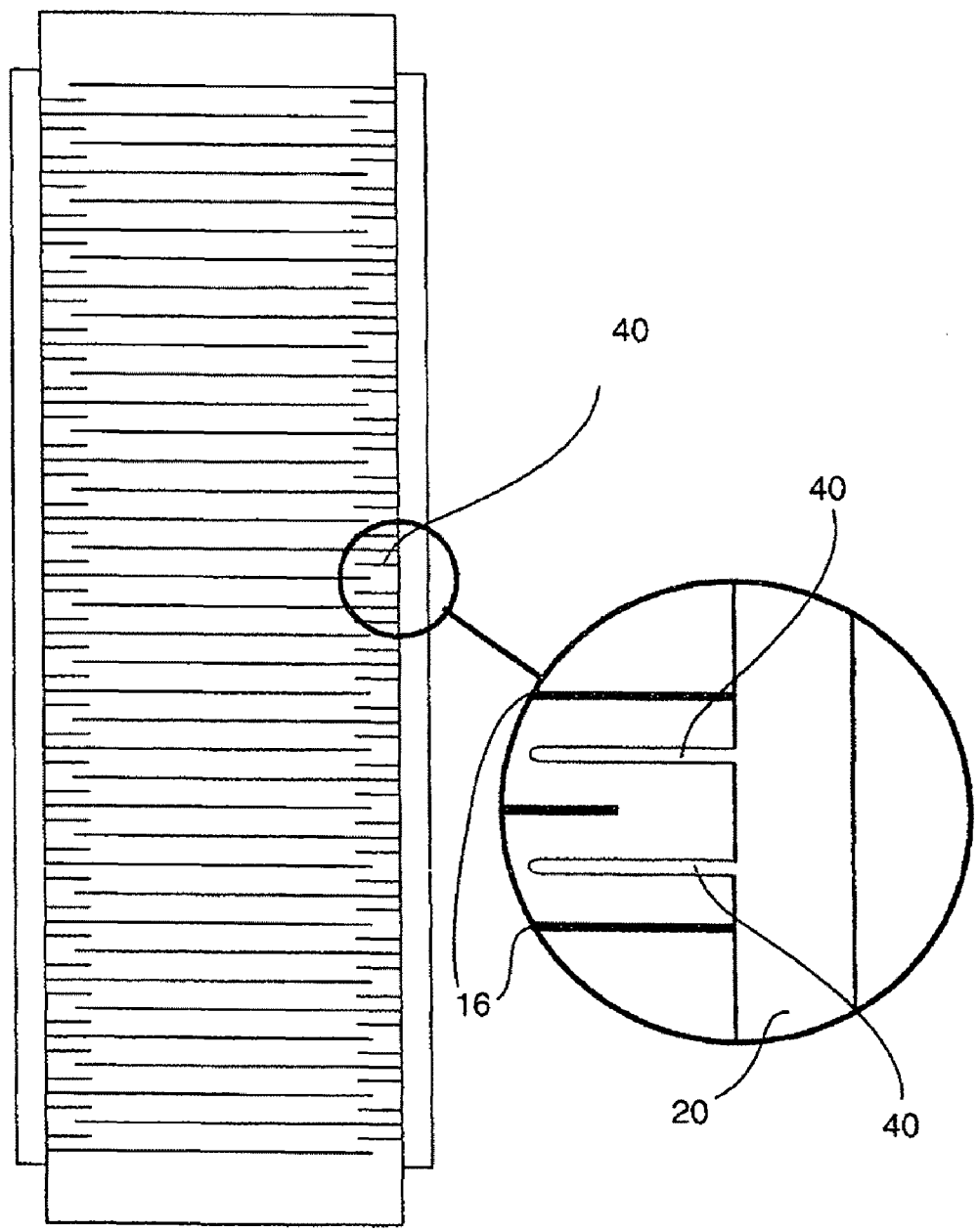
Fig. 6
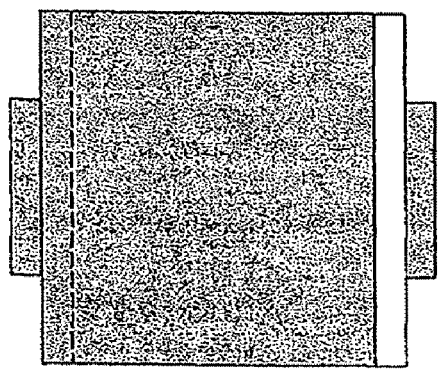

PIEZOELECTRIC ACTUATOR

TECHNICAL FIELD

The invention relates to a piezoelectric actuator comprising a plurality of piezoelectric elements arranged in a stack. In particular, but not exclusively, the invention relates to a piezoelectric actuator for use in a fuel injector of a fuel injection system of an internal combustion engine.

BACKGROUND TO THE INVENTION

FIG. 1 is a schematic view of a piezoelectric actuator having a piezoelectric stack structure 10 formed from a plurality of piezoelectric layers or elements 12 separated by a plurality of internal electrodes. FIG. 1 is illustrative only and in practice the stack structure 10 would include a greater number of layers and electrodes than those shown and with a much smaller spacing. The electrodes are divided into two groups: a positive group of electrodes (only two of which are identified at 14) and a negative group of electrodes (only two of which are identified at 16). The positive group of electrodes 14 are interdigitated with the negative group of electrodes 16, with the electrodes of the positive group connecting with a positive external electrode 18 of the actuator and the negative group of electrodes connecting with a negative external electrode 20 of the actuator. The positive and negative external electrodes 18, 20 receive an applied voltage, in use, that produces an intermittent electric field between adjacent interdigitated electrodes that rapidly varies with respect to its strength. Varying the applied field causes the stack 10 to extend and contract along the direction of the applied field. Typically, the piezoelectric material from which the elements 12 are formed is a ferroelectric material such as lead zirconate titanate, also known by those skilled in the art as PZT.

The actuator construction results in the presence of active regions 22 between electrodes of opposite polarity and inactive regions (also referred to as the inactive margins) 24 between electrodes of the same polarity. In use, if a positive voltage is applied to the actuator across the external electrodes 18,20, the active regions 22 expand resulting in an extension in the length of the stack 10. The inactive regions 24, on the other hand, do not expand and it is a consequence of this that a tension is generated between the active and inactive regions 22, 24. It has been observed previously that the resulting cracks 26 which form in the inactive margins 24 of the stack 10 can lead to failure modes. The cracks 26 tend to propagate either towards an opposite polarity internal electrode or towards an opposite polarity external electrode.

It is a particular problem with crack formation that should conductive material (for example, electrode material, moisture or salts) enter the cracks 26, there is a risk of a short circuit developing. This is likely to happen after repeated operation of the actuator, and repeated extension and contraction of the stack 10, which encourages the penetration of the abovementioned foreign materials. This problem has been recognised in particular in testing piezoelectric actuators for use in fuel injectors.

It is an object of the present invention to provide an actuator in which the aforementioned problem of cracking is reduced or removed.

SUMMARY OF INVENTION

According to a first aspect of the present invention, there is provided a piezoelectric actuator comprising a stack having a plurality of piezoelectric elements formed from a piezoelectric material, a plurality of positive internal electrodes interdigitated with a plurality of negative internal electrodes to define active regions of the piezoelectric material which are responsive to a voltage applied across the internal electrodes, in use, an external positive electrode for connection with the positive internal electrodes and an external negative electrode for connection with the negative internal electrodes. The actuator is characterised in that it further comprises means for deliberately creating artificial cracks within the stack at a location at which the artificial cracks do not give rise to a short circuit between the internal electrodes, whereby the creation of the artificial cracks serves to relieve stresses within the piezoelectric material.

It is a benefit of the present invention that the artificial cracks throughout the piezoelectric stack act to relieve stresses within the remainder of the structure that could otherwise arise at locations giving rise to a short circuit between the electrodes. Deliberately forcing the creation of cracks at regions where there is no short circuit risk has now been found to be a successful way of alleviating or preventing the known short circuit failures.

In more expensive piezoelectric actuators the stacks are built by gluing together a number of relatively thin tiles together. This has the desirable effect of reducing the number of cracks, but often at unsatisfactory extra expense. It is thus well known that reducing the number of cracks in the piezoelectric stack structure is desirable, so the essence of the present invention, to deliberately try to form cracks in the structure, provides a surprising and unexpected advantage.

Preferably, the stack takes the form of a co-fired stack (e.g. fired (sintered) as a relatively long piece of material).

In one embodiment, the means for deliberately creating artificial cracks includes a plurality of intermediate layers of non-conductive material distributed throughout the stack.

Preferably, the intermediate layers are arranged at regularly spaced locations throughout the stack.

The or each of the intermediate layers may be formed from a material having a higher sintering temperature than the piezoelectric material. In this way, when the stack is sintered (or fired) to bond or fuse the elements of the stack together, the intermediate layers remain weak and do not bond or fuse together with the remainder of the co-fired stack structure.

In another embodiment, the means for deliberately creating artificial cracks comprises a plurality of additional internal electrodes distributed throughout the stack, with each of the additional electrodes having a length, across the width of the stack, which is substantially less than the length of the positive and negative internal electrodes, whereby the additional electrodes tend to delaminate, in use, to create the artificial cracks.

It may be convenient to form the additional internal electrodes in positive and negative electrode pairs, with the electrodes of each pair being located at the same axial position along the stack length, one being in connection with the positive external connection and one being in connection with the negative external electrode.

The additional internal electrodes are preferably arranged at regularly spaced locations along the stack length.

In a still further embodiment, the means for deliberately creating artificial cracks comprises at least one void region within the stack which is substantially free from piezoelectric material.

In one preferred embodiment, a plurality of void regions are located at regularly spaced locations throughout the stack. By way of example, the stack may further comprise a plurality of additional layers of non-conductive material distributed throughout the stack, wherein at least one of the additional layers of non-conductive material has a void region formed on or adjacent to it.

It is preferable for the additional layers of non-conductive material to be distributed at regularly spaced locations throughout the stack. Only selected ones of the additional layers may be provided with a void region formed on or adjacent to it, or alternatively every one of the additional layers may be provided with a void region. The additional layers of non-conductive material may take the form of non-electrode tape which is applied within the stack structure, between the active internal electrodes, to reduce the risk of any porosity bridging the distance between the internal electrodes.

Each of the positive internal electrodes extends from the positive external electrode across the width of the stack to define a first gap with the negative external electrode, and each of the negative internal electrodes extends from the negative external electrode across the width of the stack to define a second gap with the positive external electrode. In another embodiment, a void region is located within at least one of the first or second gaps to define the means for deliberately creating artificial cracks within the co-fired stack.

For example, the or each void region may result from the application of a burnt-out ink-based material applied within the stack.

At least one of the void regions may be filled with an electrically insulating material, or alternatively the void regions may remain unfilled.

Each of the positive and negative internal electrodes defines an electrode contact region at the end of the electrode that connects with the positive or negative external electrode, respectively. In another embodiment, an upper edge of at least one of the electrode contact regions has a void region formed on or adjacent to it.

Alternatively, one or more of the electrode contact regions is embedded with at least one of the void regions. In this case, one or more of the electrode contact regions may be provided with a plurality of void regions, wherein neighbouring ones of the void regions within the electrode contact region are separated by a conductive bridging region of the electrode contact region to maintain a conductive path between the internal and external electrodes.

In a modification, the or each void region extends around the periphery of the stack to contact sides of the stack provided with the positive and negative external electrodes and sides of the stack without the positive and negative external electrodes.

According to a second aspect of the invention, there is provided a method of forming a piezoelectric actuator comprising the steps of providing a stack having a plurality of piezoelectric elements formed from a piezoelectric material, wherein the piezoelectric material has a piezoelectric sintering temperature at which the elements of the stack bond or fuse together to form a co-fired stack structure. The method further includes firing the stack so as to bond the elements of the stack together to form the co-fired stack whilst leaving weak or void regions at the selected locations, whereby the weak or void regions provide a means for creating artificial cracks within the co-fired stack structure, when in use.

According to a third aspect of the invention, there is provided providing a method of forming a piezoelectric actuator including providing a stack having a plurality of piezoelectric elements formed from a piezoelectric material, providing a burnable material at selected locations within the stack, firing the stack to produce a co-fired stack, and burning the burnable material to leave void regions in the selected locations in the co-fired stack which are free from the piezoelectric material, whereby the void regions provide a means for creating artificial cracks within the co-fired stack.

It will be appreciated that the various optional and preferred features of the first aspect of the invention may be incorporated within the second and third aspects of the invention also, alone or in appropriate combination, as will be apparent from the examples in the following description.

BRIEF DESCRIPTION OF DRAWINGS

The invention will now be described, by way of example only, with reference to the accompanying drawings in which;

FIG. 6 is a schematic diagram of a piezoelectric actuator of a fifth embodiment, similar to that shown in FIG. 5 but with a greater number of additional intermediate layers.

DETAILED DESCRIPTION OF PREFERRED EMBODIMENTS

The piezoelectric actuator of the present invention incorporates a co-fired stack structure, meaning that the stack structure is produced by firing (i.e. sintering) a relatively long structure formed from multiple layers of piezoelectric material. Conventionally, co-fired stacks are formed by stacking sheets having a ceramic powder held together by a binder (e.g. PVA). The binder is first burnt out at a relatively low temperature to allow the binder to be released without damaging the weak structure. This results in a very weak structure of loosely bonded ceramic powder with voids where the binder used to be. When the structure as a whole is sintered (fired) at the higher temperature, the loosely bonded particles of ceramic fuse together to form a relatively void free, dense and much stronger structure. Co-fired stacks of the aforementioned type are distinguished over actuators which are formed by clamping or gluing individual tiles together, each of which itself may have a co-fired multi-layer structure. Such individual tile actuators are more expensive to manufacture and pose a prohibitively high cost for many applications. Co-fired actuators of the type described here typically include only one or two co-fired stacks, rather than a high multiple of thinner co-fired stacks or tiles that are glued together. For the purpose of the following description, an actuator having a single co-fired stack is described.

Figure 1:
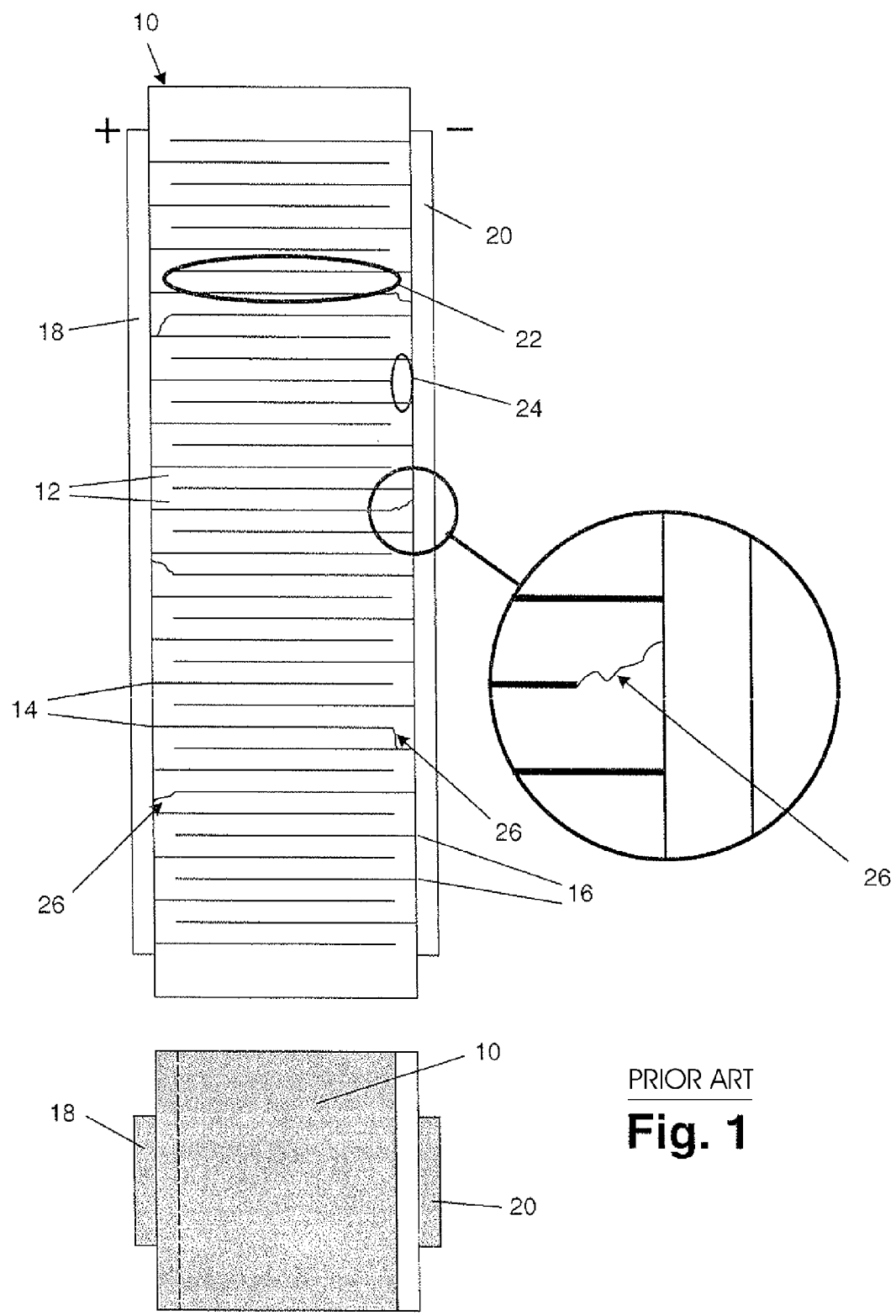
FIG. 1 is a schematic diagram of a piezoelectric actuator known in the prior art to illustrate the problem of cracking between inactive and active regions of the piezoelectric material.
Figure 2:
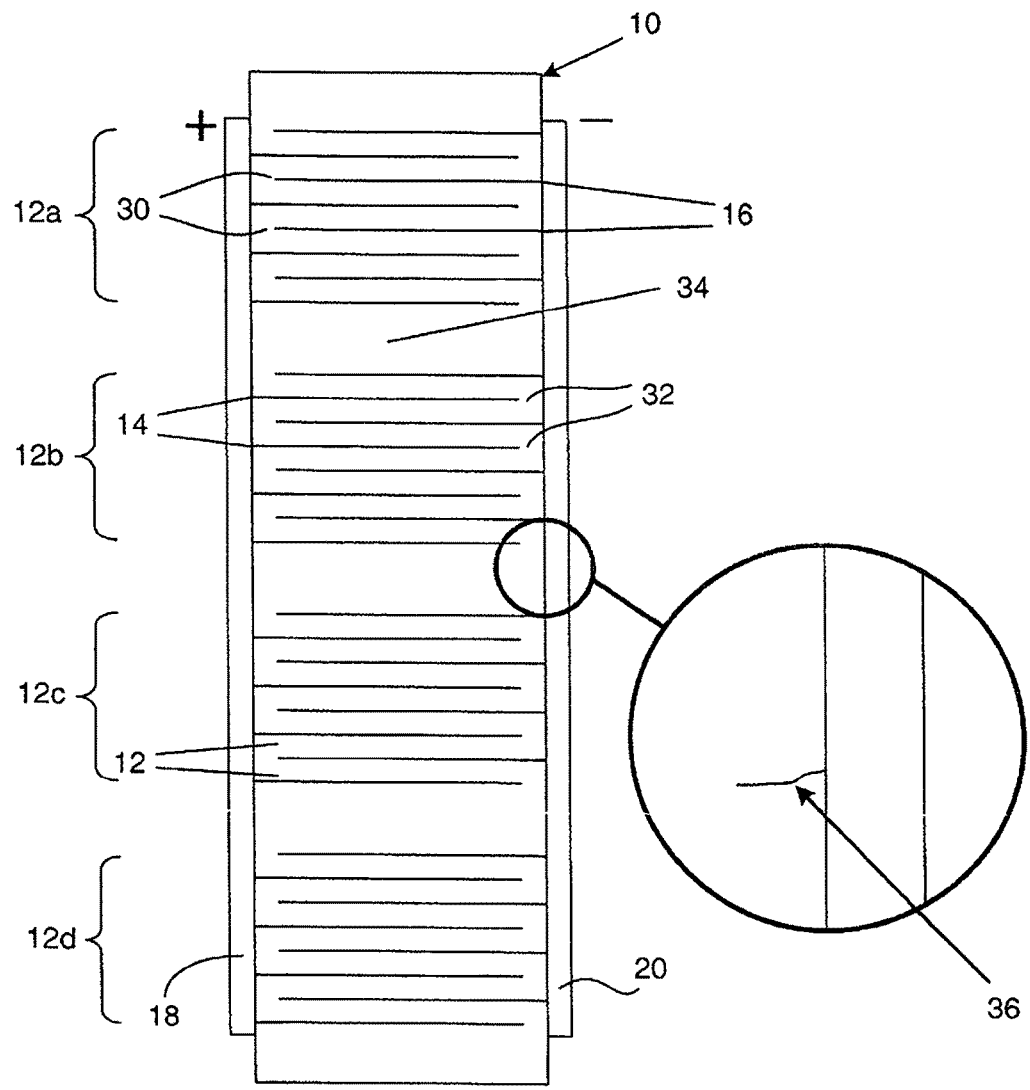
FIG. 2 is a schematic diagram of a piezoelectric actuator of a first embodiment of the invention having a plurality of additional weak layers distributed throughout the stack.
Figure 2:
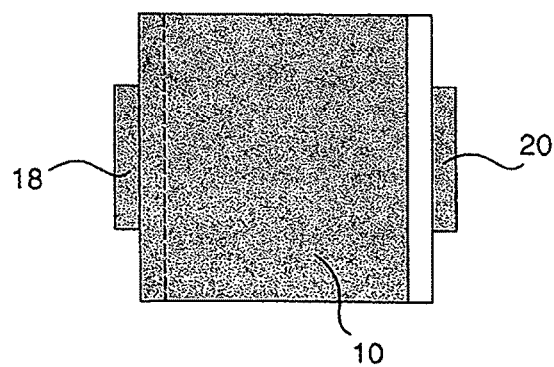

Referring to FIG. 2, a piezoelectric actuator of a first embodiment of the invention includes a stack 10 of piezoelectric elements 12 (only two of which are identified) separated by a plurality of internal electrodes 14, 16. The actuator in FIG. 2 has a similar structure to that shown in FIG. 1, in that the internal electrodes are divided into two groups: a positive group of electrodes 14 and a negative group of electrodes 16. The positive group of electrodes 14 are interdigitated with the negative group of electrodes 16, with the electrodes 14 of the positive group connecting with a positive external electrode 18 of the actuator and the electrodes 16 of the negative group connecting with a negative external electrode 20 of the actuator. Each of the negative internal electrodes 16 extends from the negative external electrode 20 to a point part way across the width of the stack 10 so that the unconnected end of the negative internal electrode 16 defines, together with the edge of the stack 10, a first narrow gap region 30 (only two of which are identified). Likewise, each of the positive internal electrodes 14 extends from the positive external electrode 18 to a point part way across the width of the stack 10 so that the unconnected end of the positive internal electrode 14 defines, together with the edge of the stack 10, a second narrow gap region 32.

The stack elements 12 and internal electrodes 14, 16 are divided into a number of distinct sub-groups (as indicated at 12a, 12b, 12c, 12d), each of which includes a plurality of stack layers and a plurality of positive and negative electrode pairs. A distinguishing feature of the actuator in FIG. 2 is that each of the sub-groups 12a-12d is separated from its neighbouring sub-group or sub-groups by means of an additional layer 34 of weak, non-electrode, non-conductive material. The additional layers 34 are regularly spaced throughout the stack 10 and provide a means for deliberately creating artificial cracks 36 (only one of which is identified) within inactive regions of the stack 10, with the effect of relieving stresses in other areas of the structure. Because the formation of a crack relieves stresses in the surrounding material, another crack cannot form unless the stress has built up again within the surrounding region. The deliberately created artificial cracks therefore serve to alleviate the generation of cracks within the inactive margins (as described with reference to FIG. 1). As the additional layers 34 are located in positions for which the cracks arising cannot give rise to short circuiting between internal electrodes of opposite polarity, the problems encountered in conventional stack designs are avoided.

Suitable materials for the additional layers may be either a ceramic material with naturally low strength or a material that has a higher sintering temperature than the sintering temperature of the piezoelectric material (i.e. the sintering temperature at which the final dense structure is formed). During the sintering process to bond the whole structure together, the weaker layers are created within the structure because the additional layers 34 remain porous and poorly bonded at a temperature for which the remainder of the structure becomes densified and well bonded. As dopants and sintering aids are often added to the piezoelectric materials to reduce the sintering temperature, one convenient way of implementing the embodiment of FIG. 1 is to form the additional layers 34 from the same core material as the piezoelectric elements 12, but one for which the propensity for densification is lower. So, for example, to create the additional layers 34 the piezoelectric material may be kept substantially free from or to have a relatively low concentration of, sintering aids or dopants in these regions.

As an alternative to using a lack of a sintering aid to generate layers of weak piezoelectric material, the weak layers may be formed by other ceramic materials. For example, suitable materials include those having a higher sintering temperature than the piezoelectric material (e.g. alumina) or materials having a poor reactivity with the piezoelectric material (e.g. silicon nitride). It is also possible to add dopants to the piezoelectric material to make the piezoelectric material more difficult to sinter in the weak layers. Another option is to add an excess of binder in the initial stage of construction of the stack 10 in those areas where it is desired to create the weak layers 34.

Figure 3:
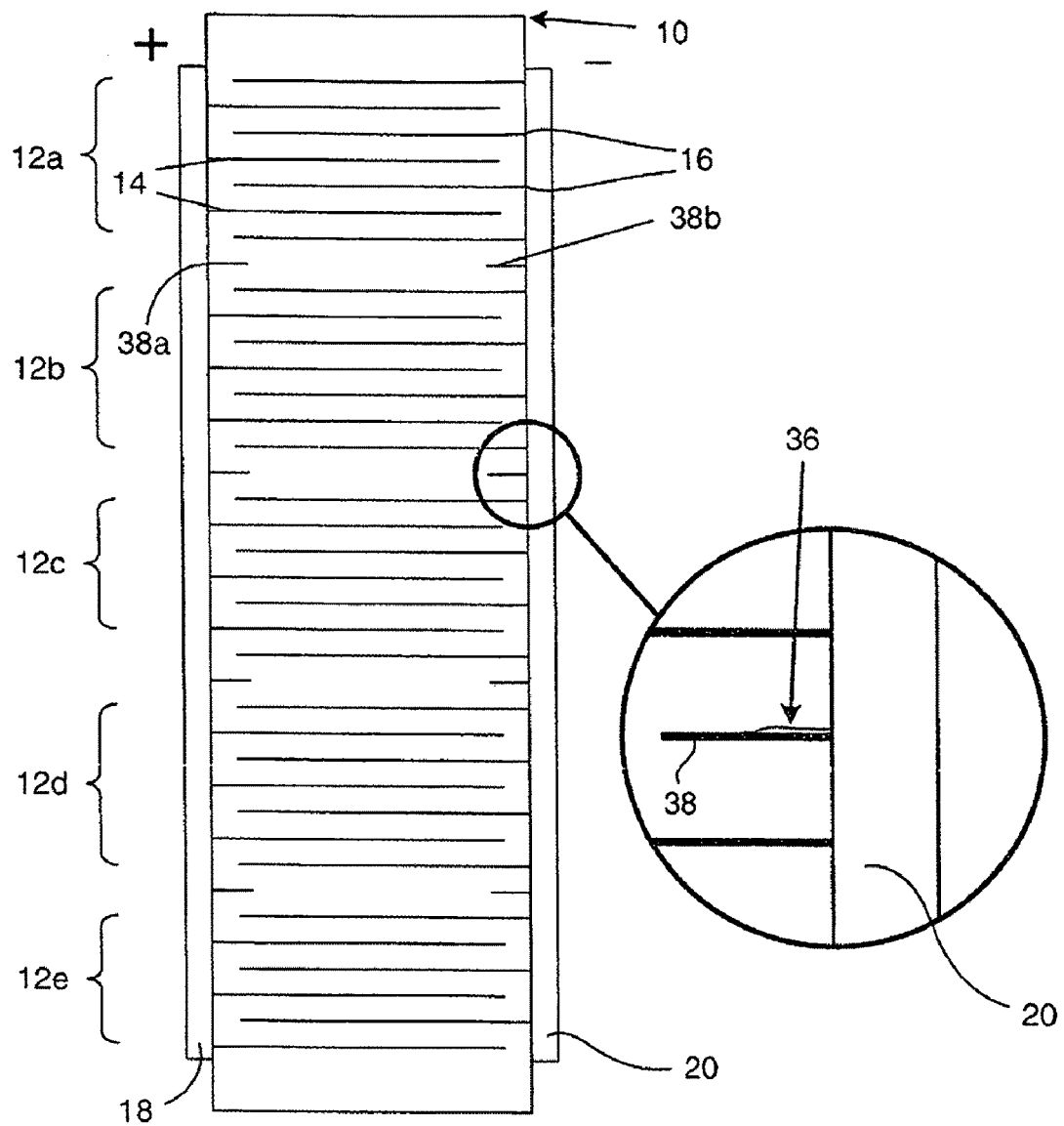
FIG. 3 is a schematic diagram of a piezoelectric actuator of a second embodiment having a plurality of additional short length electrodes distributed throughout the stack.
Figure 3:
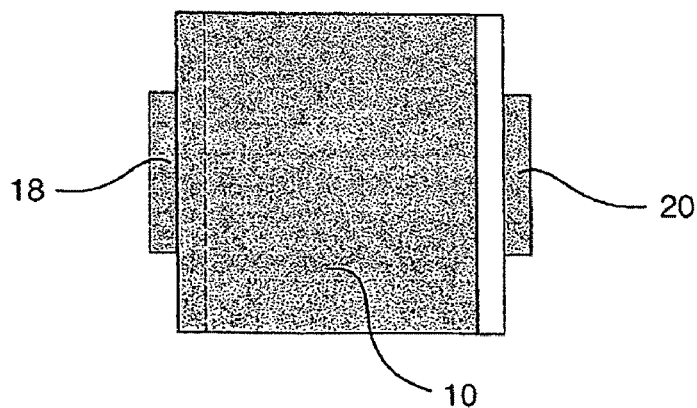

FIG. 3 shows an alternative embodiment to that shown in FIG. 2, in which pairs of additional short length electrodes 38a, 38b are introduced throughout the stack 10 to provide a means for deliberately generating the artificial cracks 36 in the piezoelectric material. Each short electrode is positioned at the same axial position along the stack length as its partner in the pair, and extends only a short way across the width of the stack 10. The pairs 38a, 38b are introduced at regularly spaced intervals throughout the stack 10, with each pair of short electrodes 38a, 38b being located between neighbouring ones of the sub-groups 12a-12d and in the location of what would otherwise be a regular internal electrode. In other words, between two positive internal electrodes of adjacent sub-groups (e.g. 12a, 12b) there is a pair of additional short electrodes 38a, 38b.

Each of the additional electrodes 38a, 38b is considerably reduced in length compared with the regular internal electrodes 14, 16. One short electrode 38a of each pair is connected to the positive external electrode 18 and the other short electrode 38b of the pair is connected to the negative external electrode 20. The short electrodes 38a, 38b are dense, or made of a material which is known to bond particularly poorly (e.g. platinum) so that the artificial cracks 36 tends to form by delamination of the short electrodes 38a, 38b, as shown in the enlarged portion of FIG. 3. As described previously, the creation of the artificial cracks 36 relieves stresses within the piezoelectric material in the surrounding regions of the stack 10, whereas the delamination of the short electrodes 38a, 38b ensures the cracks do not join up with an electrode of opposite polarity, thus avoiding any short circuiting.

Instead of additional short length electrodes 38a, 38b being provided in aligned pairs, in a modification (not shown) a plurality of short length electrodes may be provided on the negative side of the stack 10, with each one being located between neighbouring ones of the negative internal electrodes 16, and a plurality of short length electrodes may be provided on the positive side of the stack 10, with each one being located between neighbouring ones of the positive internal electrodes 14. Put another way, it is not critical that a short length electrode 38a, 38b of one polarity be aligned with a short length electrode of the opposite polarity: the short length electrodes may be positioned anywhere on their respective side of the stack. Equally, it would be possible to include short length electrodes between internal electrodes of opposite polarity. What is important is that the short length electrodes are positioned so that the artificially created cracks 36 are controlled such that they do not join up with the adjacent internal electrodes 14, 16.

Figure 4:
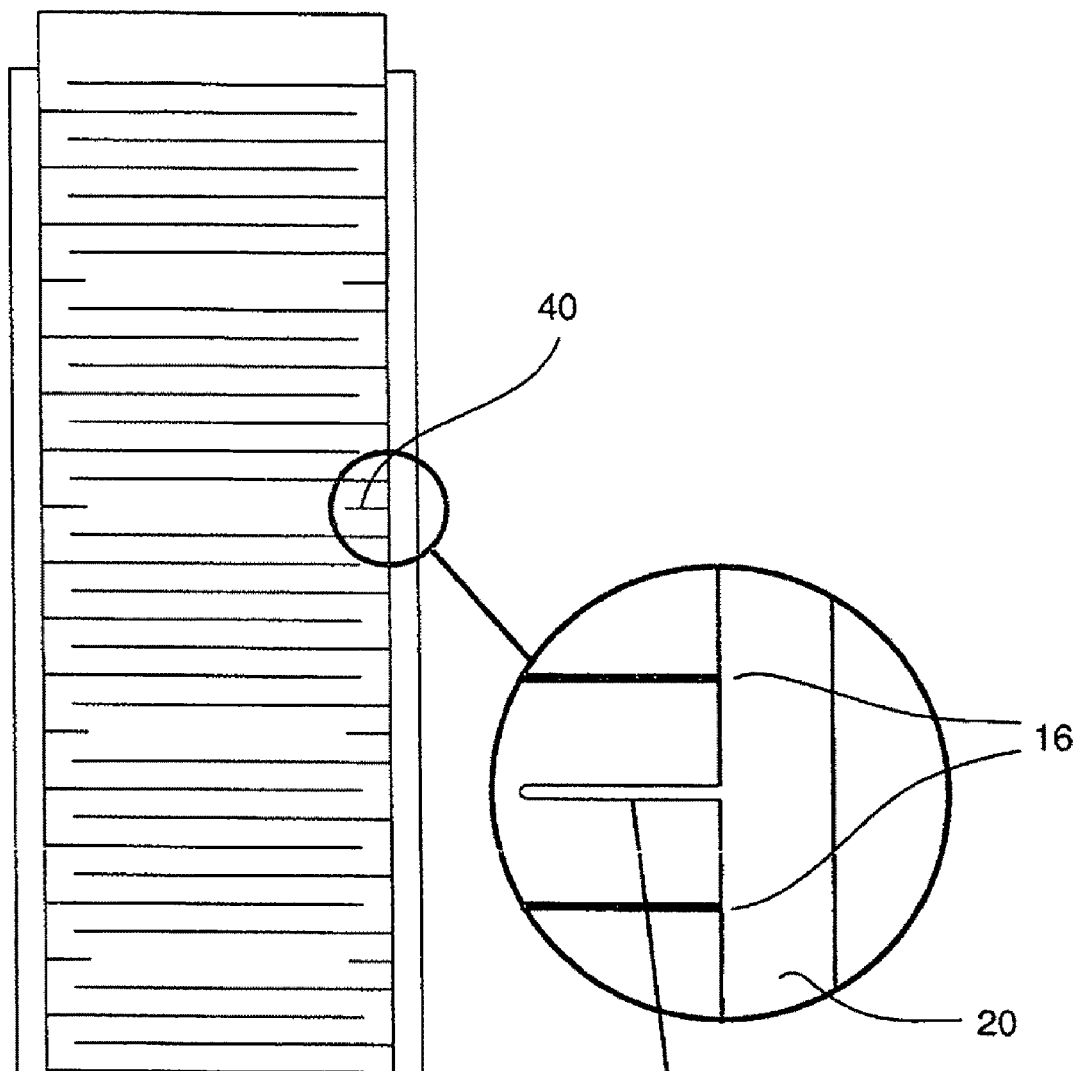
FIG. 4 is a schematic diagram of a piezoelectric actuator of a third embodiment including a plurality of void regions distributed throughout the stack.
Figure 4:
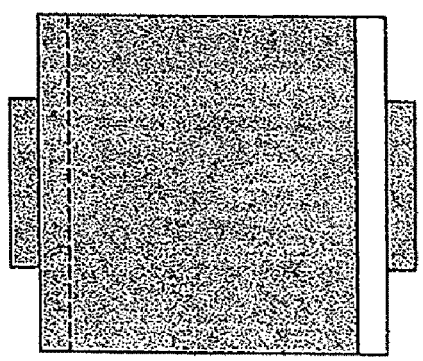

FIG. 4 shows an alternative embodiment to FIG. 3, where instead of the short electrode lengths being provided between neighbouring sub-groups, a porous zone or void region 40 is created in place of the short electrodes. One means of forming the void regions 40 is to provide a graphite-based ink in the required location which is then burnt out during the manufacturing process to leave a space substantially free from piezoelectric material, as shown in the enlarged portion of FIG. 4. The void region 40 may remain unfilled or, in an alternative embodiment, the void region 40 may be filled with another material, providing the material is one that does not cause the artificial crack to propagate. The void regions 40 serve to generate artificial cracks in the piezoelectric structure which relieve stresses in the piezoelectric material and, hence, alleviate or prevent the generation of cracks elsewhere which are liable to create a short circuit.

Figure 5:
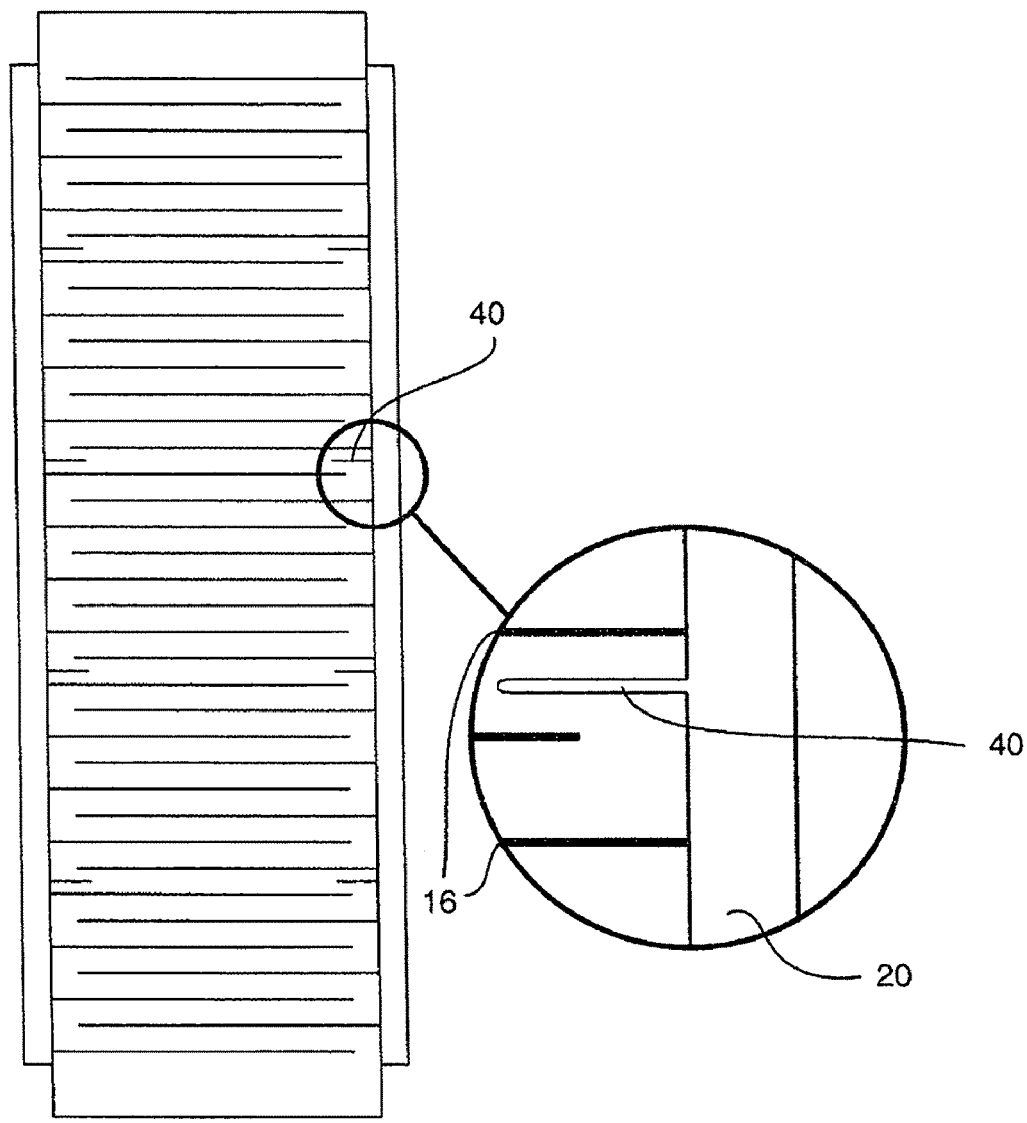
FIG. 5 is a schematic diagram of a piezoelectric actuator of a fourth embodiment including additional intermediate layers between opposite polarity electrodes.
Figure 5:
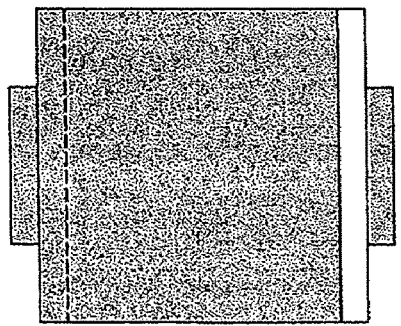

It is known to form a piezoelectric stack 10 with one or more intermediate layers of non-electrode tape (not visible) between the active internal electrodes 14, 16 to reduce the risk of any porosity bridging the distance between the internal electrodes. For a stack 10 having a structure such as this, the embodiment of FIG. 4 may be implemented by introducing the ink that is to be burnt onto some of the intermediate layers of non-electrode tape. FIG. 5 shows an example of this. In this embodiment the intermediate layers are arranged at regularly spaced intervals along the stack length, between neighbouring ones of the positive and negative electrodes 14, 16, with the void regions 40 located on (i.e. adjacent to) the intermediate layers.

Because the implementation described in FIG. 5 does not introduce any extra inactive material into the stack 10, it is possible to apply the ink to every intermediate layer, as shown in FIG. 6, so as to provide an increased number of void regions 40. This has the benefit that no significant tension is generated in any of the inactive regions. Not only does this prevent cracks forming, but it also results in a greater actuator displacement as the active regions are not restrained by inactive regions. Such a reduction in the 'clamping' effect of the inactive regions also reduces the longitudinal distortion generated by margin asymmetry, which helps to maintain parallelism.

Figure 7:
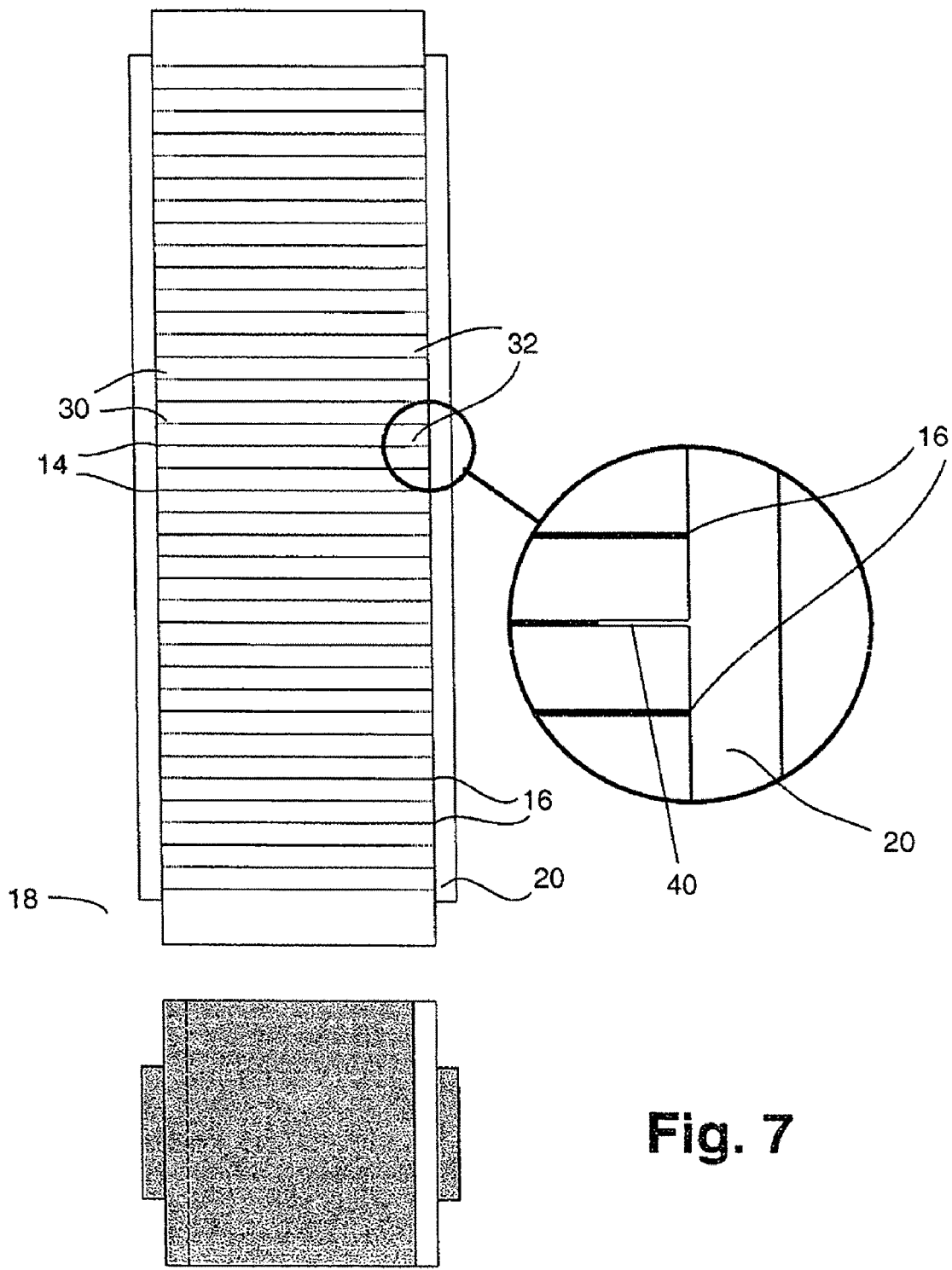
FIG. 7 is a schematic diagram of a piezoelectric actuator of a sixth embodiment having a void region between the end of each internal electrode and the edge of the piezoelectric stack.

In another embodiment, the ink that is to be burnt out may be printed onto the same piezoelectric layer as that on which the internal electrode is provided so as to produce the porous voids. FIG. 7 shows one example where the ink is applied to the gap regions 30, 32 between the unconnected end of each internal electrode 14, 16 and its associated external electrode 18, 20 at the edge of the stack 10. When the ink is burnt out, the void region 40 is created between the unconnected end of each electrode 14, 16 and its associated external electrode 18, 20. This implementation does not result in any extra inactive material, and so it is an option to apply the ink in the gap region 30, 32 for every one of the internal electrodes 14, 16. The void region 40 must be either of sufficient length to ensure there is no conduction between the unconnected end of the internal electrode 14, 16 and its associated external electrode 18,20 or, alternatively, the void region 40 may be filled with an electrically insulating material.

Figure 8:
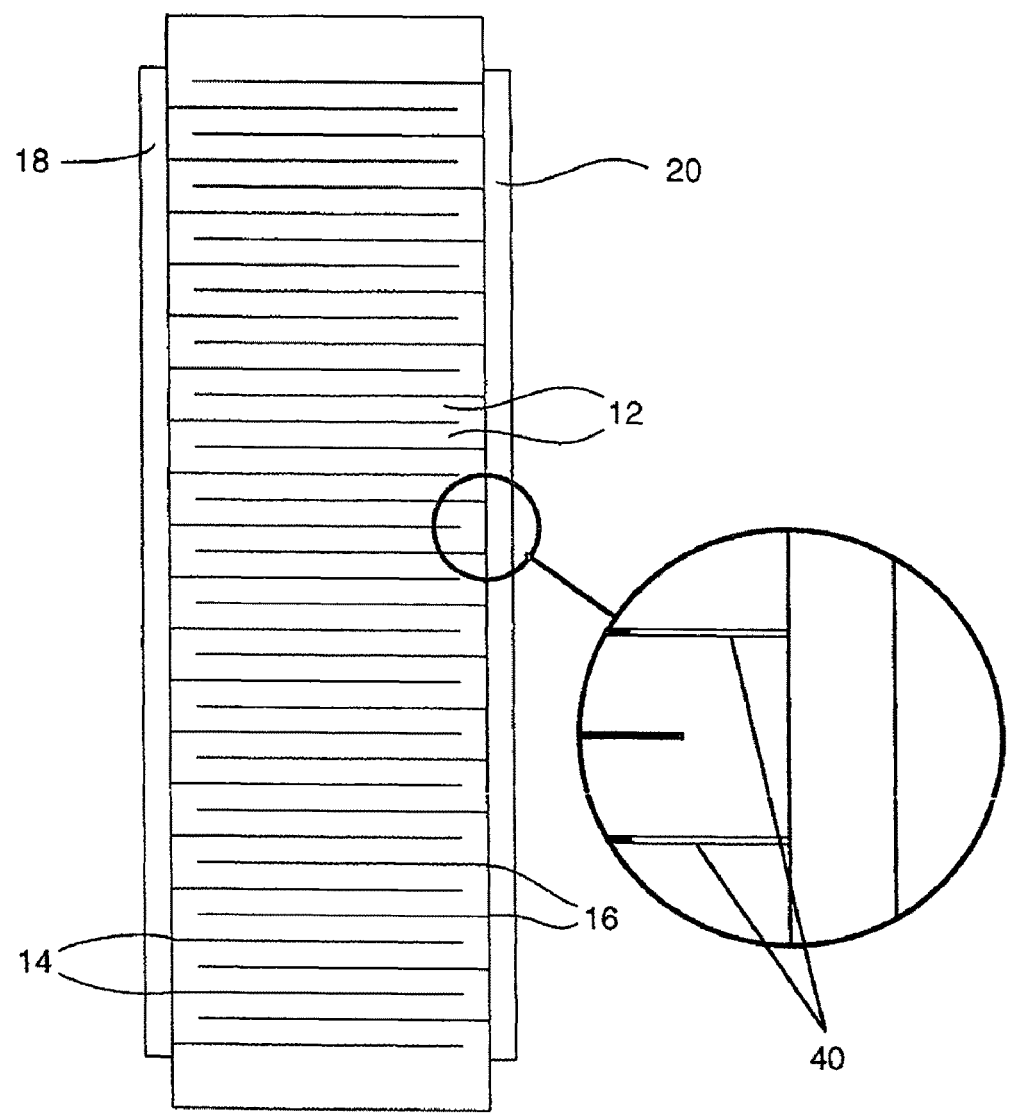
FIG. 8 is a schematic diagram of a piezoelectric actuator of a seventh embodiment including multiple void regions at the end of each internal electrode.
Figure 8:
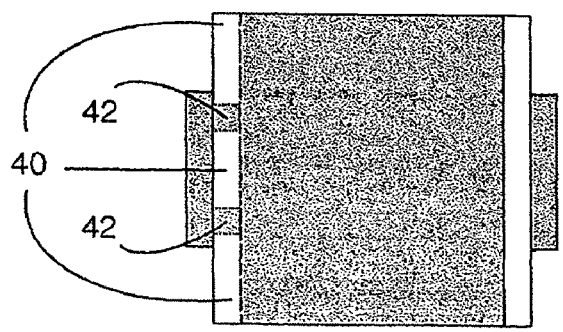

FIG. 8 shows a further variation in which porous void regions 40 are embedded within an electrode contact region between the connected end of each internal electrode 14, 16 and its associated external electrode, 18, 20 respectively. The void regions 40 are thus located on or adjacent to one of the piezoelectric elements 12 (e.g. by applying burnable ink to the elements 12) and at regularly spaced intervals along the stack length. In any given electrode contact region the void 40 cannot span the full depth of the stack 10 (i.e. into the page as shown) as a conduction path must be maintained between the internal and external electrodes, 14, 18 and 16, 20. As best seen in the lower portion of FIG. 8, multiple void regions 40 are thus provided in the electrode contact region to extend, at regularly spaced intervals, through the stack depth. In the example shown, three void regions 40 are provided in the electrode contact region, which also includes two bridging regions 42 in between the void regions 40 to provide the required conduction path between the internal and external electrodes. It is a particular advantage of this embodiment that the void regions 40 need not be electrically insulating and that each bridging region 42 acts as an electrical fuse to disconnect the internal electrode 14, 16 should it short out.

A variation (not shown) of FIG. 8 has only one void region 40 embedded within each electrode contact region, the void region 40 being located at a corner of the stack and the remainder of piezoelectric material through the stack depth defining the bridging region to maintain the conduction path between the internal and external electrodes.

Figure 9:
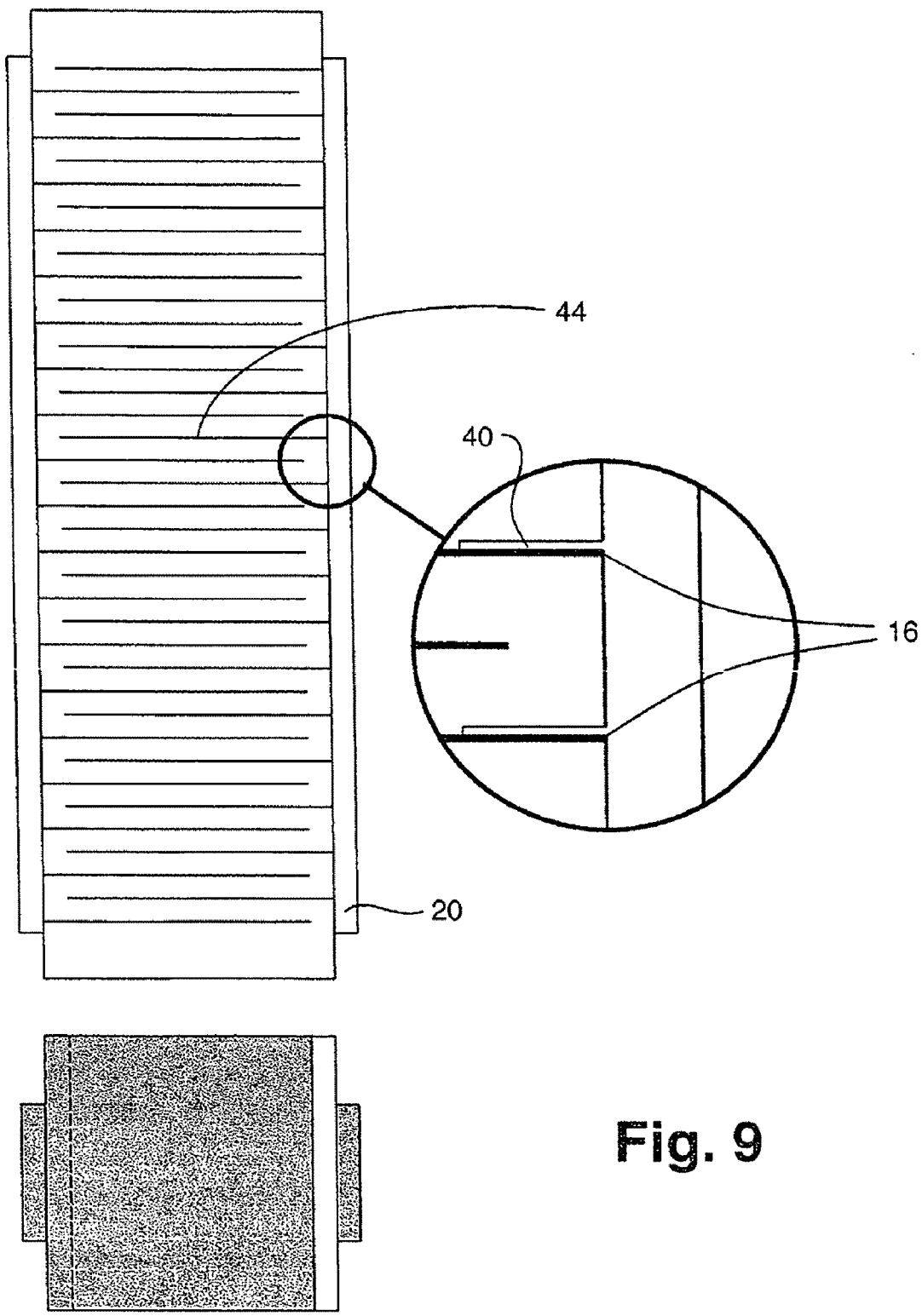
FIG. 9 is a schematic diagram of a piezoelectric actuator of an eighth embodiment, similar to FIG. 8 but in which the void regions are provided at upper edges of the internal electrodes.

FIG. 9 shows a variation of the embodiment of FIG. 8, in which each void region 40 is located in the electrode contact region between the internal electrode 14, 16 and its associated electrode 18, 20 and along an upper edge 44 of the internal electrode. As best seen in the enlarged portion of FIG. 9, each void region 40 extends through the full depth of the stack 10 and, although it does not influence the conduction path between the internal and external electrodes, the same advantages are provided as described previously, namely that the void regions 40 provide a means for deliberately creating artificial regions of weakness in the piezoelectric stack structure 10.

Figure 10:
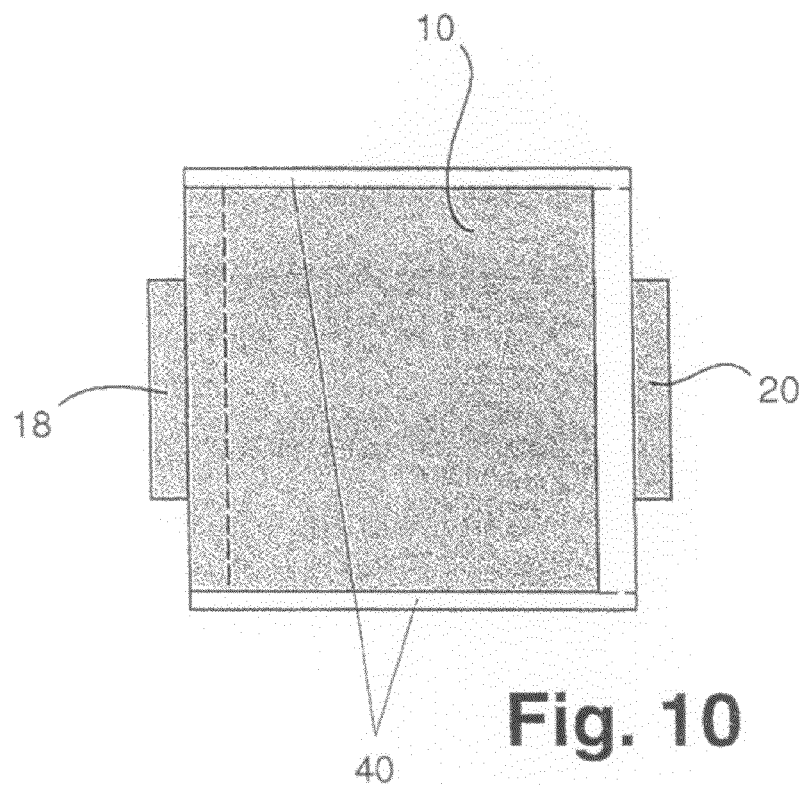
FIG. 10 is a schematic diagram of a piezoelectric actuator of a ninth embodiment in which the void regions of FIG. 9 extend around the periphery of the stack.

FIG. 10 shows an embodiment that is similar to FIG. 9, in which the void regions 40 are again provided on the upper edges 44 of the internal electrodes but so that the regions 40 extend around the full periphery of the stack 10. In other words, the regions 40 extend across both the facing side surfaces of the stack 10 provided with the external electrodes 18, 20 and on the two interposed facing surfaces which do not have external electrodes. One further benefit of the embodiment in FIG. 10 is that the risk of surface flashover effects is reduced (i.e. electrical conduction between opposite polarity electrodes brought to the same surface).

Figure 11:
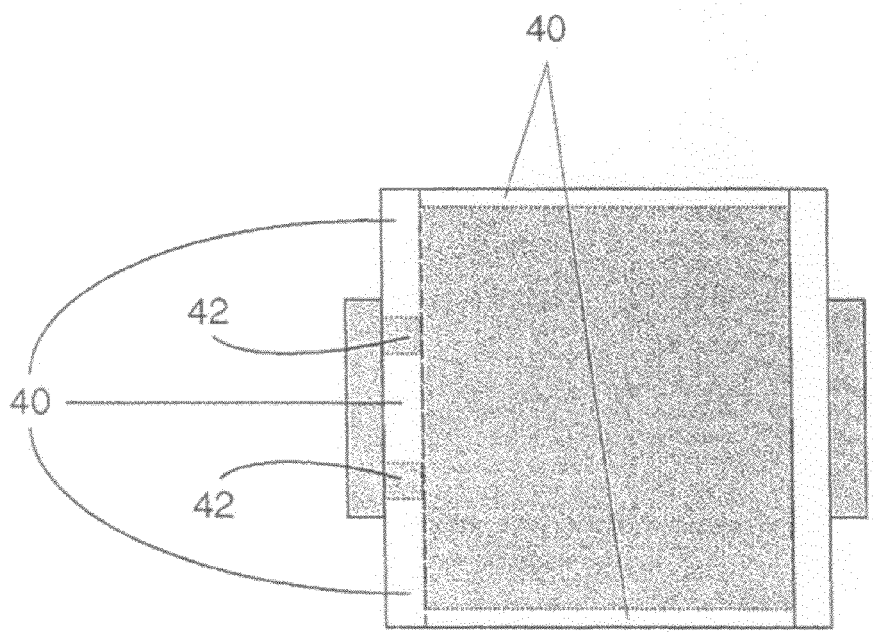
FIG. 11 is a schematic diagram of a piezoelectric actuator of a tenth embodiment, similar to FIG. 8 but in which the multiple void regions extend around the periphery of the stack.

FIG. 11 is a further embodiment, similar to that shown in FIG. 8, in which the void regions 40 provided in the electrode contact region extend around the full periphery of the stack 10. As in FIG. 8, each of the electrode contact regions includes a plurality of void regions 40 which extend through the depth of the stack 10, interspersed with a plurality of bridging regions 42.

What is claimed is:

1. A piezoelectric actuator comprising:
a stack of piezoelectric elements formed from a piezoelectric material,
a plurality of positive internal electrodes interdigitated with a plurality of negative internal electrodes throughout the stack to define active regions of the piezoelectric material that are responsive to a voltage applied across the internal electrodes, in use,
an external positive electrode for connection with the positive internal electrodes, and
an external negative electrode for connection with the negative internal electrodes,
wherein the stack further comprises means for deliberately creating artificial cracks within the stack at a location at which the artificial cracks do not give rise to a short circuit between the internal electrodes but serve to relieve stresses within the piezoelectric material, and wherein the means for deliberately creating artificial cracks includes a plurality of intermediate layers of non-conductive material extending across the full width of the stack from the external positive electrode to the external negative electrode, said intermediate layers distributed throughout the stack;

wherein said intermediate layers are formed from a material having a higher sintering temperature than the piezoelectric material.

2. The piezoelectric actuator as claimed in claim 1, wherein the intermediate layers are arranged at regularly spaced locations throughout the stack.

3. A method of forming a piezoelectric actuator, the method comprising the steps of:
providing a stack having a plurality of piezoelectric elements formed from a piezoelectric material, wherein the piezoelectric material has a piezoelectric sintering temperature at which the elements of the stack bond or fuse together,
providing, at selected locations within the stack, intermediate layers extending across the full width of the stack of a non-conductive material having a sintering temperature that is higher than the piezoelectric sintering temperature, and
firing the stack so as to bond the piezoelectric elements of the stack together to form a co-fired stack structure while leaving weak regions at the selected locations, whereby the weak regions provide a means for creating artificial cracks within the co-fired stack structure, when in use.

4. The piezoelectric actuator as claimed in claim 1, wherein a plurality of the piezoelectric elements and a plurality of the internal electrodes define a plurality of sub-groups, each sub-group separated from adjacent sub-groups by one of said intermediate layers.

* * * * *